US006693536B2

(12) United States Patent
Bauer Jr. et al.

(10) Patent No.: US 6,693,536 B2
(45) Date of Patent: Feb. 17, 2004

(54) ELECTROMAGNETIC RADIATION MONITOR

(75) Inventors: John August Bauer Jr., Indian Mills, NJ (US); Gerald Francis Mikucki, Delran, NJ (US); David Staiman, Cinnaminson, NJ (US); Paul Douglas Hammond, Mt. Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 85 days.

(21) Appl. No.: 10/016,583

(22) Filed: Oct. 31, 2001

(65) Prior Publication Data

US 2003/0080277 A1 May 1, 2003

(51) Int. Cl.[7] .......................... G08B 13/26; G08B 17/12
(52) U.S. Cl. .................. 340/561; 340/600; 340/521; 340/522; 340/567; 324/96; 324/501; 250/493.1; 250/494.1
(58) Field of Search .................. 340/600, 511, 340/545.3, 521, 522, 567, 561; 324/501, 96; 250/493.1, 494.1, 495.1

(56) References Cited

U.S. PATENT DOCUMENTS

| | | | |
|---|---|---|---|
| 4,034,289 A | 7/1977 | Rozylowicz et al. | 324/95 |
| 4,365,192 A | 12/1982 | Rankin et al. | 324/72 |
| 4,414,632 A | 11/1983 | Murrell | 364/487 |
| 4,472,715 A * | 9/1984 | Kern et al. | 340/587 |
| 4,526,028 A * | 7/1985 | Hubner | 340/632 |
| 4,539,567 A | 9/1985 | Brewer | 343/351 |
| 4,668,940 A * | 5/1987 | Beard et al. | 340/521 |
| 4,672,309 A | 6/1987 | Gandhi | 324/95 |
| 4,777,657 A | 10/1988 | Gillaspie | 455/186 |
| 4,973,944 A | 11/1990 | Maletta | 340/568 |
| 5,164,662 A | 11/1992 | Emery et al. | 324/158 |
| 5,394,164 A | 2/1995 | Gandhi et al. | 343/831 |
| 5,414,366 A | 5/1995 | Rogers | 324/627 |
| 5,495,282 A | 2/1996 | Mostafa et al. | 348/5 |
| 5,592,148 A | 1/1997 | Morales | 340/540 |
| 5,627,521 A | 5/1997 | Olsen et al. | 340/600 |
| 5,629,622 A * | 5/1997 | Scampini | 324/247 |
| 5,714,932 A | 2/1998 | Castellon et al. | 340/539 |
| 5,999,889 A | 12/1999 | Tietsworth | 702/65 |
| 6,088,889 A | 7/2000 | Luther et al. | 455/226.1 |

* cited by examiner

Primary Examiner—Donnie L. Crosland
(74) Attorney, Agent, or Firm—Duane Morris LLP

(57) ABSTRACT

A site or vehicle which includes a plurality of electromagnetic radiators monitors the radiation by the use of a plurality of broadband sensors spaced about the potential radiation site or vehicle. Each of the sensors produces signals indicative of the sensed power, and process the signals for transmission over a data network. The system also includes a processing system which receives the signals indicative of the sensed power from all of the sensors, and processes the signals to determine whether radiation levels are within the established values. The signals may be processed either at the sensors or at the processing system to form average or peak power determinations. The power levels are continuously compared with threshold levels. When the threshold is exceeded, warnings may be given, or automatic shutdown of the radiator may be instituted (136).

3 Claims, 7 Drawing Sheets

ELECTROMAGNETIC RADIATION MONITOR

FIELD OF THE INVENTION

This invention relates to the monitoring of electromagnetic power for safety purposes.

BACKGROUND OF THE INVENTION

In the past, high power electromagnetic radiators could be sited well away from populated areas. For example, when long-wave transatlantic radio communications were begun, the site selected for the very large transmitting antennas was on Long Island, then a sparsely populated region. High power electromagnetic radiators must be designed and manufactured, and the design and manufacturing process involves relatively large numbers of skilled personnel, ordinarily found only in urban and suburban regions. Thus, high power electromagnetic radiators may sometimes be found in urban or suburban locations when design, testing or manufacture is involved. Also, high power electromagnetic radiators may occasionally be sited in densely populated areas, such as major airports.

It has long been known that high power electromagnetic radiators could be harmful to humans and animals. The harmful heating effects of even low-power radars, as well as the potential of certain body structures, such as eye sockets, for exacerbating heating effects, were well known in the 50s. Also, the cold-war-era Ballistic Missile Early Warning System (BMEWS) included radar of such high power that food subject to the transmissions could literally be cooked, and it was well understood that animal tissues similarly placed could be severely harmed.

While no study has shown that electromagnetic radiation is harmful to people at power levels below those which cause heating effects, many people are made uncomfortable by the thought of being subjected to radio-frequency electromagnetic radiation, even from low-power sources such as cell phones. In the past, notwithstanding the cost, surveys of the region surrounding electromagnetic radiation sites have been made using portable sensors, and plots of the radiation intensity made from the recorded results. These plots could then used as a basis for determining the risk to the local population. The operators of a facility which operates electromagnetic radiating systems such as radars, radio or television transmitters may deem it advisable to keep the surrounding community advised of the nature of any radiations, and to make other efforts to allay the fears of the population. Improved methods for measuring and controlling electromagnetic radiation from a fixed site are desirable.

SUMMARY OF THE INVENTION

According to an aspect of the invention, an integrated electromagnetic radiation monitoring system is for monitoring a set of controllable radiation sources (which may be only one source) which, when operating, radiate electromagnetic energy having wavelengths greater than that of infrared, where the radiation sources are capable of being shut down by radiation inhibit signals. The monitoring system includes a plurality of sensors spaced about the set of radiation sources, for sensing at least one of peak and average electromagnetic power within at least some of the wavelengths, for producing digitized signals representing the peak or average power. Additionally, the monitoring system includes a control arrangement coupled to the set of radiation sources and to the plurality of sensors, for comparing the digitized signals with a given threshold level, and for, in response to the digitized signals exceeding the threshold, generating the inhibit signals, whereby the radiation sources are shut down when the sensed electromagnetic power exceeds the threshold.

In a particular embodiment of the invention, the control arrangement further activates an alarm signal concurrently with the generation of the inhibit signals. The alarm signal may ultimately result in sounding of an aural or visual alarm.

In a particularly advantageous embodiment of the monitoring system, the control arrangement further compares the digitized signals with a second threshold level. The second threshold level represents less sensed power than that represented by the given threshold level, and generates a warning signal when the second threshold level is crossed.

DESCRIPTION OF THE INVENTION

Figure 1:
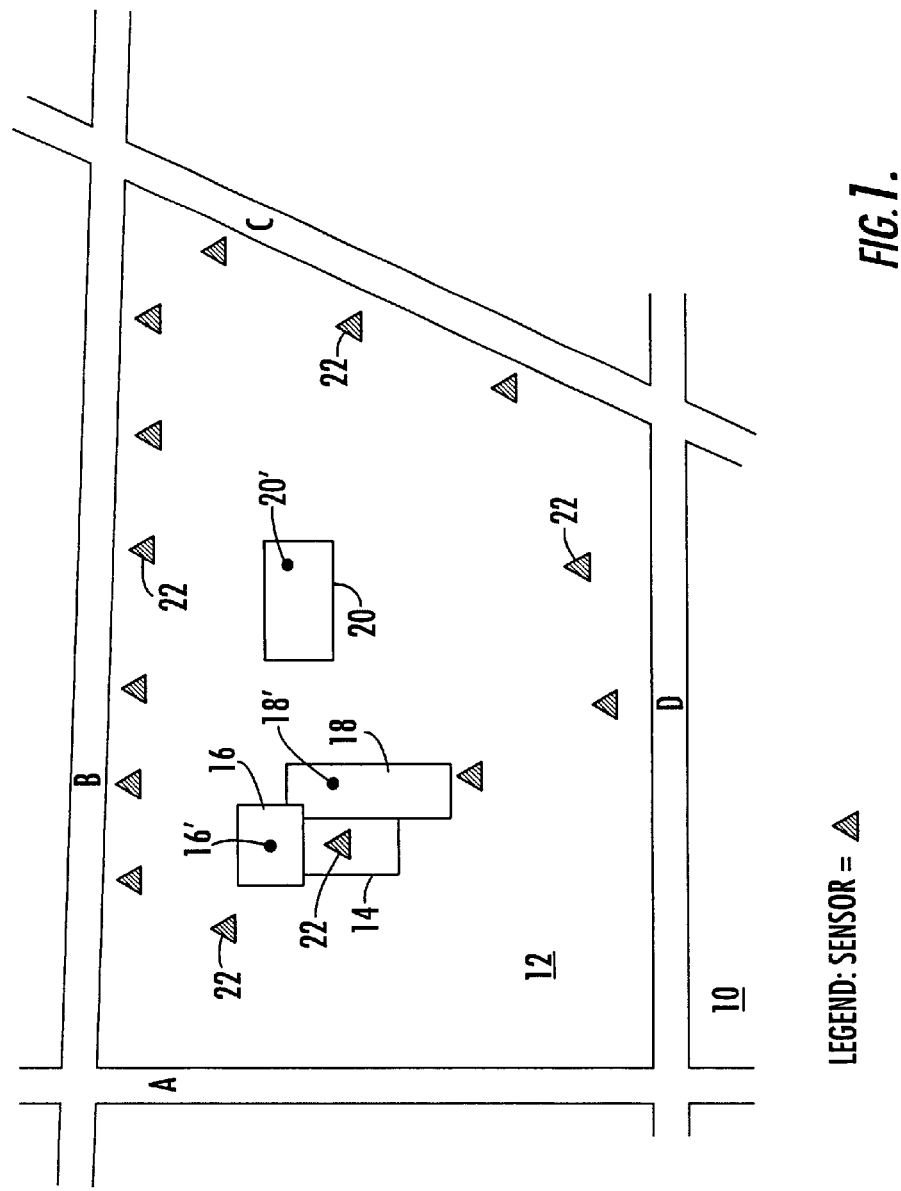
FIG. 1 is a plan or map illustrating a hypothetical design, manufacture and test plant including locations at which electromagnetic radiation takes place, and also illustrating the locations of sensors for producing signals representative of electromagnetic power.

In FIG. 1, a hypothetical industrial plant 10 includes a site or plot of land 12 bounded by four roads, designated A, B, C, and D. The site includes several buildings or structures 14, 16, 18, and 20, some of which may contain or bear electromagnetic radiation equipment, such as radio, radar or television broadcast equipment, or at which transmitters or antennas are tested at full power. Such electromagnetic radiation equipment or generators are indicated by dots designated 16', 18', and 20'. The electromagnetic signal generators 16', 18', and 20' may be continuously operated, or may be occasionally operated, as in a design or manufacture facility. According to an aspect of the invention, the facility 12 is populated by a plurality of sensors, illustrated in FIG. 1 by hatched triangles, some of which are designated 22.

Figure 2:
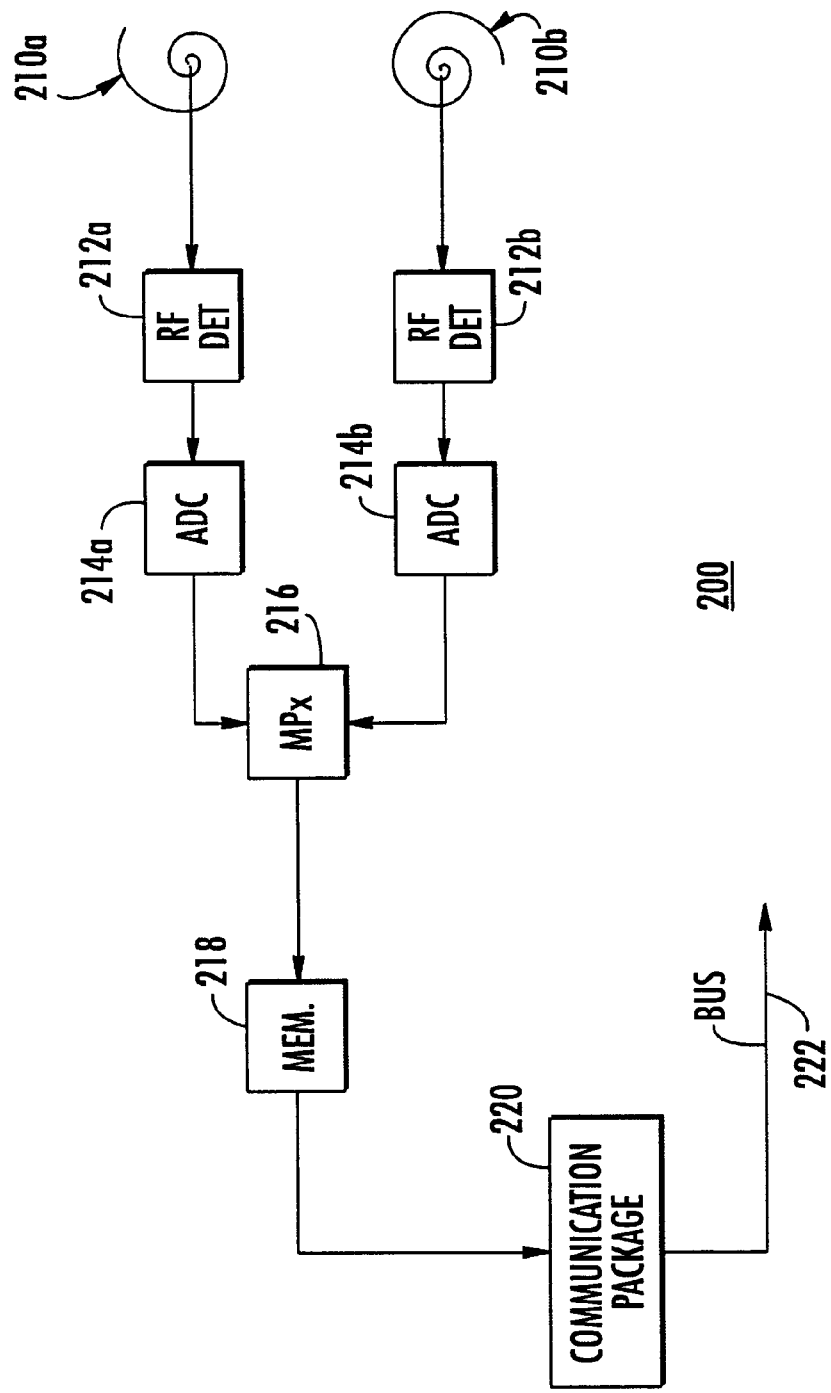
FIG. 2 is a simplified block diagram of a sensor such as is used in FIG. 1.

FIG. 2 illustrates details of a sensor 200 which may be used as one of the sensors 22 in the arrangement of FIG. 1. In FIG. 2, a first nominally circularly polarized antenna 210a receptive to a first hand (that is, one of right-hand or left-hand) of circular polarization couples received signals to a radio-frequency (RF) detector illustrated as a block 212a. The resulting detected analog signals, representing received electromagnetic signals of the one hand of polarization, are applied to a high-speed analog-to-digital converter (ADC) illustrated as a block 214a, which converts the detected analog signals into digital signals.

In FIG. 2, the antenna 210b is responsive to electromagnetic signals of the other hand of circular polarization, and the resulting received signals are applied to an RF detector 212b, which generates detected analog signals representing received electromagnetic radiation of the other hand of circular polarization. The detected analog signals are applied to an ADC 214b, which converts the signals to digital form.

Those skilled in the antenna arts know that an antenna capable of receiving nominally circularly polarized signals is also capable of receiving linearly polarized signals. Conventionally, linearly polarized signals are said to be in one of "vertical" or "horizontal" polarizations, to distinguish between the two orthogonal components, even though the components may not be truly vertical or horizontal. Since the antennas 210a and 210b are both circularly polarized, each will be responsive to only one hand of circularly polarized radiation. Since there are two such antennas, of mutually opposite hand, one or the other of antennas 210a or 210b will always respond to incident radiation which contains components of circularly polarized radiation. In addition, each antenna will respond to both vertical and horizontal linearly polarized radiation. Further, it should be understood that "circular" polarization is only an ideal, and the term includes noncircular polarization which might otherwise be termed "elliptical."

Those skilled in the antenna arts also know that antennas are fully responsive to signals only within a predetermined frequency band. Some antennas are tuned, either by the use of reactances which resonate with the inherent reactances of the antenna structure, or by their structure, so that they are receptive to radiation only within a limited frequency range. One such type of antenna is the dipole, which is optimal at only one frequency, and which tends to provide degraded performance at other frequencies. Other types of antennas, generally known as "frequency independent" antennas, provide relatively uniform performance over a broad band of frequencies. Thus, an Archimedean spiral or Equiangular spiral antenna may provide substantially uniform response over a 10:1 frequency range, or even more. Some such antennas can operate over a 20:1 frequency range. Ideally, a broadband antenna, whatever its type, should be used in the sensors when the greatest bandwidth is desired.

The digital signals produced at the outputs of ADCs 214a and 214b of FIG. 2 are applied by way of a multiplexer or controller 216 to a digital memory 218 for temporary storage. The information relating to the received signals for the two different hands of polarization are stored separately and handled separately in the sensor 200 of FIG. 2. The digital signals are stored in memory 218 at least until they can be applied to a communications block 220, for transmission over a data path 222 to a central location for evaluation. While data path 222 is illustrated as a bus, it may be any kind of path, including a wireless path or an optical bus. Thus, the sensor 200 of FIG. 2 senses electromagnetic signals of nominal circular or linear polarization at the location of the sensor, generates digital signals representing the magnitude of the signals separately for each of the two antennas, and sends those signals to a central location for evaluation.

Figure 3:
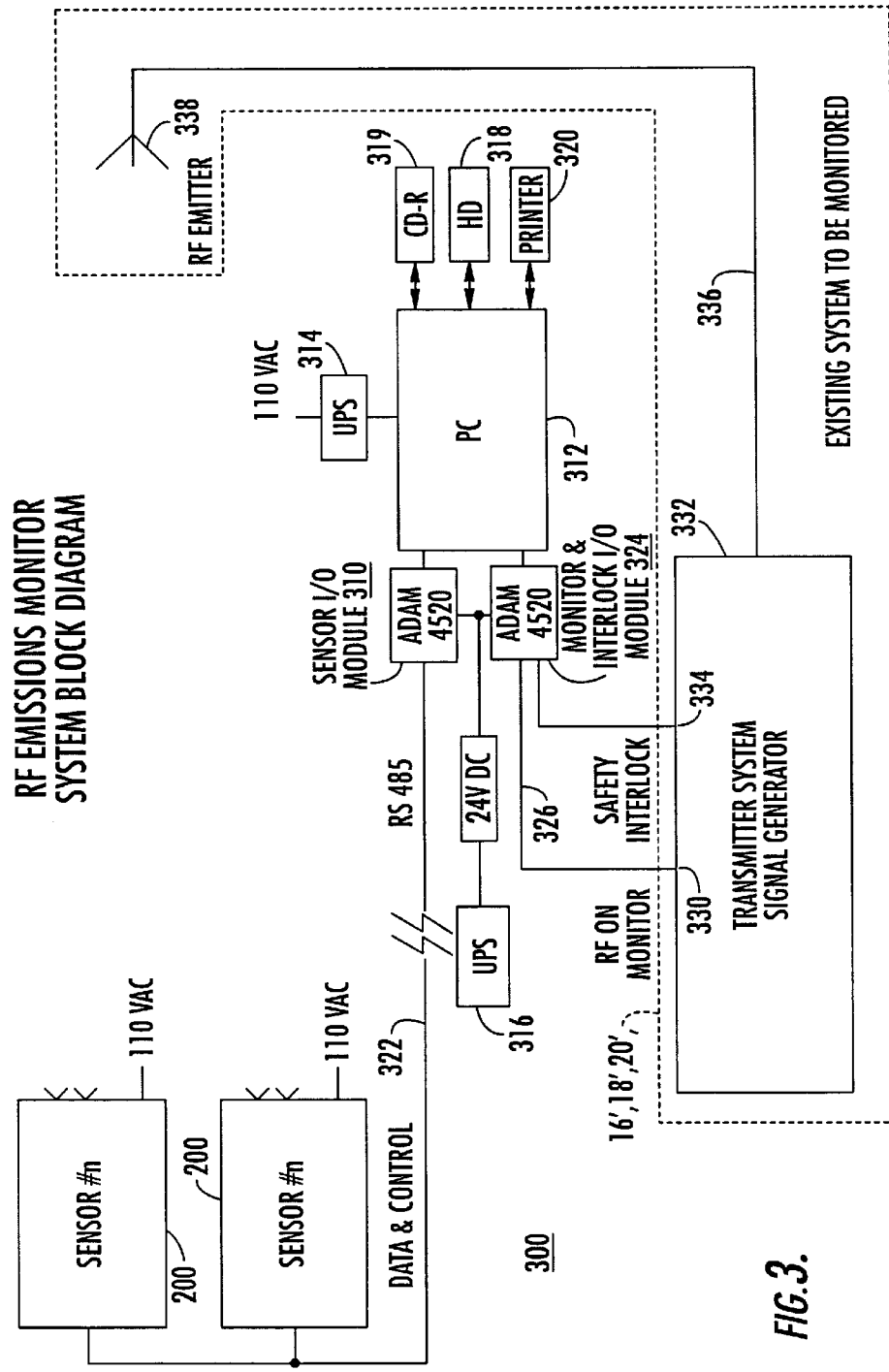
FIG. 3 is a simplified block diagram of a monitoring system according to an aspect of the invention.

FIG. 3 is a simplified block diagram of a complete system according to an aspect of the invention. In FIG. 3, a plurality of sensors such as 200 of FIG. 2 are coupled by a data and control path 322 to a sensor input/output (I/O) device illustrated as a block 310, which acts as an interface between the sensors and a processor 312, which performs the processing for the monitoring system. Processor 312 is ideally powered from an uninterruptible power source (UPS) 314, and the interface block 310 is also so powered from a UPS 316. Processor 312 is fitted with all the accoutrements, such as hard drive (HD) 318, CD-ROM recorder/player 319, and printer 320.

In FIG. 3, the radiation source(s) is represented by a block 16',18',20', which includes a transmitter or signal generator 332 and an RF emitter 338. Also in FIG. 3, processor 312 is coupled by an appropriate interface 324 and possibly another communication path 326 (or possibly another portion of communication path 322) to the RF ON Monitor port 330 of the local transmitter or RF signal generator 332, and also to the safety interlock input port 334 of signal generator 332. Transmitter or signal generator 332 is connected by an RF path 336 to its own RF emitter or antenna 338.

In general, the processing performed within processor 312 of FIG. 3 is, for each separate sensor, to produce signals representing the instantaneous peak amplitude in both polarizations, and the short-term average. The duration over which the average is computed, which may be any duration. However, the duration over which heating effects might be perceived suggests that a duration of about three seconds might be appropriate. In addition to determining the peak and average values of received power for each sensor 200, processor 312 also compares the peak and average powers with one or more threshold values. More particularly, processor 312 compares the peak and average power values of each sensor with a first or lower threshold, which represents a power level less than that which is considered to be excessive, but which is higher than the levels normally experienced during normal operation. When this lower threshold is exceeded, a warning signal is generated. The warning signal is intended to advise the operators of the high-power radiators that the power level is higher than usual, so that corrective measures can be taken, if appropriate. It will be understood that some testing may require operation at such a power level, notwithstanding that it is greater than the usual power level. The received peak and average signal levels as monitored by each sensor 200 are also compared with "maximum" threshold values, and when the maximum threshold value is exceeded for a given length of time, alarm signals and transmitter disable signals are generated. The alarm signals may sound audible alarms in the local community, to thereby warn personnel to vacate the region, and or the transmitter disable signals are coupled to the safety interlock ports of all the transmitters or signal generators under control of the monitoring system, to shut them down. The appropriate duration that the higher threshold is exceeded before the alarm and disable signals are generated may just enough to avoid an alarm due to transient effects such as lightning strikes or the like, perhaps one half-second.

Figure 4A:
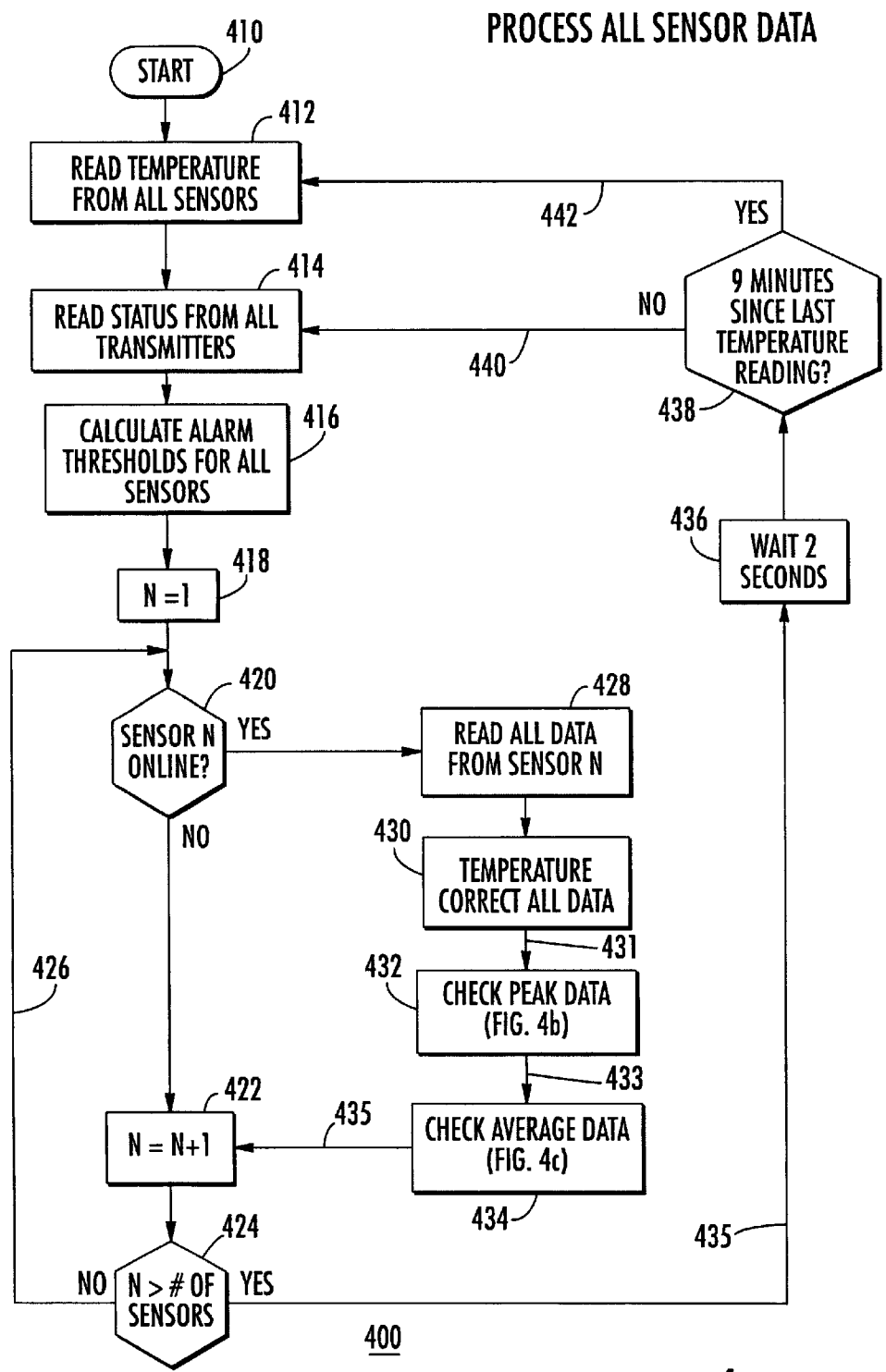
FIGS. 4a, 4b, 4c, and 4d are simplified logic flow charts or flow diagrams illustrating one possible software configuration according to an aspect of the invention for processing all sensor data, checking peak data, checking average data, and shutting down the transmitters, respectively.

FIG. 4a is a simplified logic flow diagram or flow chart 400 illustrating the logic processing performed within, or associated with, processor 312 of FIG. 3 during operation, to perform the abovedescribed processing of sensor data functions. In FIG. 4a, the logic begins at a START block 410, and proceeds to a block 412, which represents reading of the temperature data from all of the sensors 200 associated with the system. The temperature information and the identities of the sensors are placed in temporary storage. From block 412, the logic flows to a block 414, which represents the reading of the current ON or OFF status of all of the transmitters or signal sources under the control of the system. From block 414, the logic flows to a block 416, which represents calculation or retrieval of the alarm thresholds for each of the sensors. The alarm threshold takes into account the sensitivity of the sensor, its distance from the transmitters and from the region being protected, the allowable power density at the sensor, and the like. Many of the factors will remain the same from one processor cycle to the next, and may simply be previously calculated information, rather than new information calculated anew during each processor cycle.

From logic block 416 of FIG. 4a, the logic proceeds to logic block 418, which represents the setting of a running variable N to a value of unity or 1. N represents the sensor number. From block 418, the logic flows to a decision block 420. Block 420 represents a determination of whether the $N^{th}$ sensor is on-line. If the sensor is on-line, the logic leaves decision block 420 by the YES output, while if the $N^{th}$ sensor is off-line, the logic leaves by the NO output and arrives at block 422. Block 422 represents the incrementing of running variable N to N=N+1. The logic leaves block 422, and flows to a further decision block 424. Decision block 424 compares the current value of N with the total number of sensors, to determine if all the sensors have been scanned. If the running variable N indicates that the total number of iterations of the current processor cycle is not sufficient to have read all of the sensors, the logic leaves decision block 424 by the NO output and proceeds by way of a logic path 426 back to decision block 420. When an on-line sensor is found, the logic proceeds from decision block 420 to a block 428, which represents the reading of all the data from the current or Nth sensor. From block 428, the logic proceeds to a block 430, which represents temperature-correction of the sensor data, using a correction table or equation, as appropriate, to make the correction. The temperature data is preferably that measured at the sensor, but in some cases it may be sufficient to use the temperature from a representative location.

From block 430 of FIG. 4a, the logic flows by way of a logic path 431 to a block 432, which represents the determination or checking of the peak power values represented by or "of" the data. From block 432, the logic flows by way of a logic path 433 to a further logic block 434, which represents the determination or checking of average power data. From block 434, the logic flows by way of a logic path 435 back to block 422, for incrementing the running variable N to proceed to measurement of other sensors, if such there be.

Eventually, all of the N sensors will have been read, and the logic of FIG. 4a will be routed by decision block 424 to the YES output. From the YES output of decision block 424, the logic flows by way of a logic path 435 to a block 436, which interposes a delay which establishes the sensor system sampling rate. Following the delay interposed by block 436, the logic enters a decision block 438, which route the logic by way of a YES output and a logic path 442 to block 412 if a particular time, illustrated as being nine minutes, has elapsed since the last temperature reading, and which routes the logic by way of its NO output and a logic path 440 to block 414 if less than nine minutes have elapsed. The nine minute interval is selected as being one in which the temperature is deemed to remain constant. In some cases, such as in the case of windy locations or exposed, low thermal time constant sensors, a lesser time may be appropriate, and times longer than nine minutes may be appropriate for other locations and sensors. The logic iterates continually, making sensor measurements at intervals determined by the delay in block 436, and temperature measurements at intervals determined by the nine-minute consideration of decision block 438. Naturally, the two-second measurement interval may be increased or decreased according to the desired level of assurance.

Figure 4B:
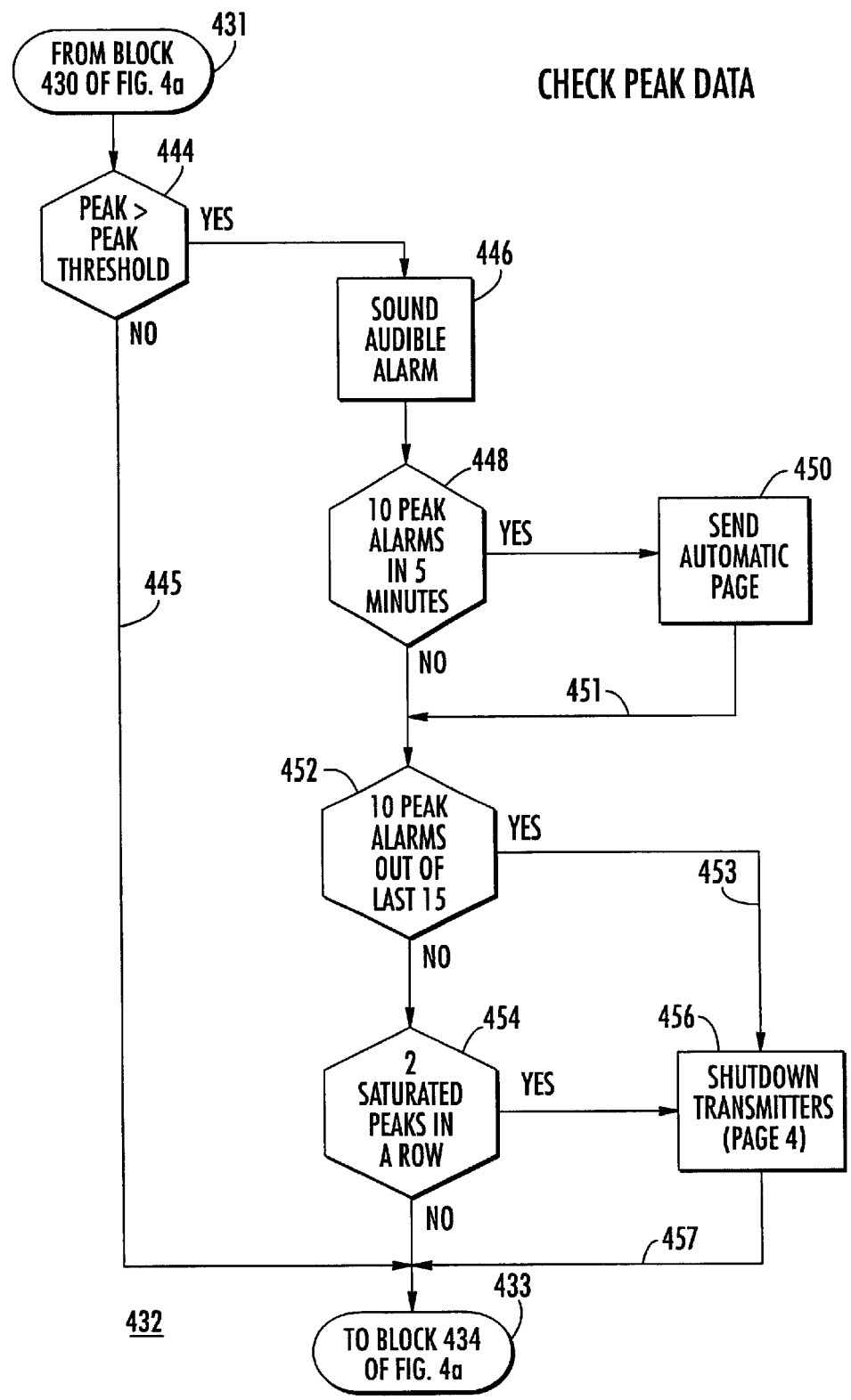

FIG. 4b is a simplified logic flow diagram or chart which illustrates the logic flow associated with peak-data checking block 432 of FIG. 4a. In FIG. 4b, the logic arrives at a decision block 444 from block 430 of FIG. 4a. Decision block 444 compares the peak value represented by the sensor data with a threshold level. If the indicated peak value is less than the predetermined threshold, the logic leaves decision block 444 by the NO output, and proceeds by way of a logic paths 445 and 433 to block 434 of FIG. 4a. On the other hand, the indicated peak level from any one of the sensors, or a plurality thereof, during any of the recurrent processor cycles, may exceed the preset threshold, which occurrence may be termed a "saturated peak". In the illustrated embodiment, a single exceeding of the threshold or saturated peak triggers an audible alarm, as suggested by block 446. However, it is anticipated that the monitoring station may intentionally not be manned, or if manned, the operator may be temporarily absent, so the sounding of an alarm at the monitoring location may not result in any action.

From block 446 of FIG. 4b, the logic proceeds to a decision block 448, which routes the logic by way of its NO output to a further decision block 452 so long as there have been no more than ten (or a selected number) of threshold-exceeded events in the last five minutes (or other selected time interval). This allows operation to continue in the presence of a noisy system, which might be the case for a system operated in an urban area or one with radiation sources other than those which are under the control of the system. On the other hand, if the predetermined number of peak alarms occur within the preset interval, the logic leaves decision block 448 by the YES output, and proceeds to a block 450, which represent the automatic sending of a page to one or more monitors or operators. In either case, the logic returns to decision block 452. Decision block 452 represents a decision predicated on a particular number of exceedings of the peak threshold in a particular time, which number is illustrated as being 10 occurrences out of the last 15 processor cycles. At two second per cycle, fifteen occurrences would occur in 30 seconds, so the system could respond in as little as 20 seconds to 10 sequential all-peak-alarms. So long as the density of alarms does not exceed the density which triggers decision block 452, the logic leaves decision block 452 by way of the NO output, and proceeds to a decision block 454. Upon the occurrence of ten-out-of-fifteen exceedings of the peak threshold, the logic leaves decision block 452 by the YES output, and arrives at a block 456. Block 456 represents the sending of a signal to the signal sources or transmitters to automatically shut them down. On the other hand, if the logic leaves decision block 452 by the NO output, the logic arrives at decision block 454, which represents the occurrence of two sequential saturated peaks. The significance of a saturation is that it is a response a signal greater than the maximum value which can actually be measured, so it represents an "unknown" large magnitude. If two sequential saturated peaks occur, meaning that the magnitude of the signal is greater than can be measured for twos successive intervals, the logic leaves decision block 454 by the YES output, and arrives at block 456 to initiate shut-down. If there have not been two sequential saturated peaks, which is to say if there is a non-saturated peak between semi-sequential cycles, the logic leaves decision block 454 by the NO output. From either block 456 or the NO output of decision block 454, the logic flows by way of path 433 back to block 434 of FIG. 4a. Thus, the logic arrangement of FIGS. 4a and 4b provides an alarm when occasional saturated peaks occur within a given time period, and shuts down the signal source (a) upon occurrence of a given proportion of saturated peaks in the measurements and (b) upon two sequential saturated peaks.

Figure 4C:
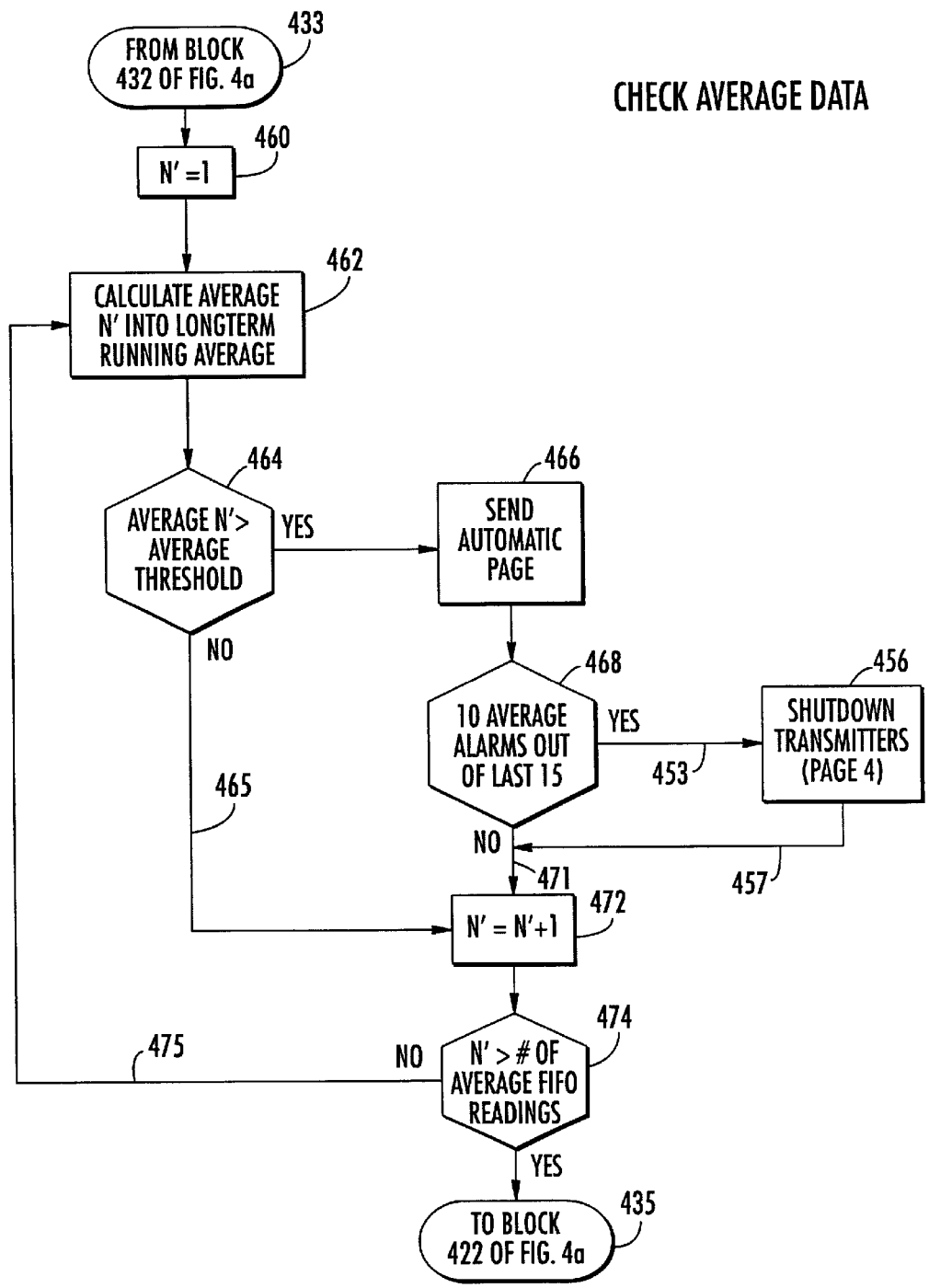

FIG. 4c is a simplified logic flow diagram or chart illustrating the logic associated with the processing of block 434 of FIG. 4a. In FIG. 4c, the logic flows from block 432 of FIG. 4a by way of path 433, and arrives at a block 460, which represents the setting of a variable N' to a value of unity or 1. For this calculation, the value of N' represents a long-term average detected power or signal. From block 460, the logic flows to a block 462, which represents calculation of the average N' into a long term running average. In an exemplary system, the long term is 30 minutes. Block 460 maintains a record of the last M samples, where in one example M=900, to form a running window of current samples, sums the values of the samples in the window, and divides by M, to form an average value or long-term running average. This provides information indicating how the power level compares with regulatory limits. From block 462, the logic flows to a decision block 464, which compares the long-term running average with a limit value or average threshold. If the long-term average is less than the threshold, the logic leaves decision block 464 by the NO output, and flows to a block 472, which represents the incrementing of variable N'. From block 472, the logic flows to a decision block 474, which compares the value of N' to the number of samples in the long-term running average. If the number of samples is less than the desired number, which in the example is 900 samples, the system is deemed to be in a start-up mode, and the logic leaves the decision block by the NO output, and returns by a path 475 to block 462, for calculation of a new running average. If, on the other hand, the number N' of samples exceeds the number within the stack containing the samples being averaged, the reading is deemed to be correct, and the logic proceeds by way of the YES output of decision block 474 to block 422 of FIG. 4a.

If the long term running average as determined by decision block 464 of FIG. 4c exceeds the threshold, the logic leaves decision block 464 by the YES output, and flows to an operator alarm or page block 466. From block 466, the logic flows to a decision block 468, which determines if, within the last fifteen samples, ten have exceeded the average threshold. If not, the logic leaves decision block 468 by the NO output, and flows to block 472. If ten or more of the last fifteen samples have exceeded the threshold, the signal sources are deemed to be too great, and the logic leaves decision block 468 by the YES output, and flows to a block 456, which results in automatic shutdown of the signal sources or transmitters.

Figure 4D:
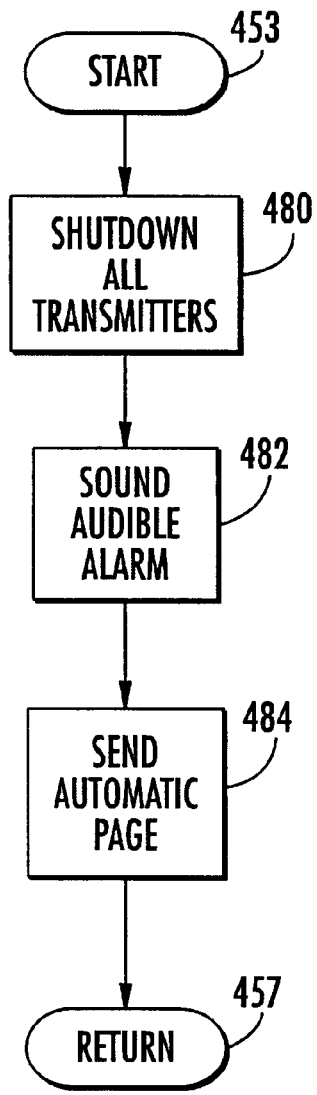

FIG. 4d is a simplified logic flow chart or diagram illustrating how the transmitter shutdown block 456 of FIGS. 4b and 4c operates. In FIG. 4d, the logic arrives by way of path 453 from either the peak or average logic processing of FIGS. 4b or 4c, and arrives at a block 480, which represents the transmission of the command to shut down the transmitter(s) or signal source(s). From block 480, the logic flows in sequence to blocks 482 and 484, which represent sounding of an audible alarm and sending of an automatic page, respectively, for the purposes set forth above. Finally, the logic returns to the main logic by way of path 457.

In operation of the arrangement of FIGS. 1, 2, 3, and 4a through 4d, even momentary excessive peak or average power sensed at any one of the system sensors produces at least warnings, and excessive peak or average power occurring at any one of the sensors on more than a momentary and nonrecurring basis results in shutdown of the controlled transmitters or signal sources.

Other embodiments of the invention will be apparent to those skilled in the art. For example, the data paths provided for interconnections between the various sensors and the monitoring locations may include both wired and wireless paths, and the wired paths may include fiber-optic portions, if desired. No particular type of data interconnection system is required, so long as its characteristics meet the minimum requirements of data transfer, reliability and cost. Commercial or special communications systems may be used. In one advantageous embodiment, a system such as that described could be used on shipboard to monitor for electromagnetic emissions when operating in a stealthy manner, in such an arrangement, the ship is in effect a stationary source relative to sensors mounted around the periphery thereof. While the sensors have been described as being mounted peripherally around the potential radiation sites, in the shipboard embodiment, they may be placed on roughly a hemisphere or semisphere, rather than in a roughly planar circle.

Thus, according to an aspect of the invention, an integrated electromagnetic radiation monitoring system (300) is for monitoring a set of controllable radiation sources (16', 18', 20')(which may be only one source) which, when operating, radiate electromagnetic energy having wavelengths greater than that of infrared, where the radiation sources (16', 18', 20') are capable of being shut down by radiation inhibit signals. The monitoring system (300) includes a plurality of sensors (200) spaced about the set of radiation sources (16', 18', 20'), for sensing at least one of peak and average electromagnetic power within at least some of the wavelengths, for producing digitized signals representing at least one of peak or average power, and preferably both. Additionally, the monitoring system (300) includes a control arrangement (310, 312, 332, 400), coupled to the set of radiation sources (16', 18', 20') and to the plurality of sensors (200), for comparing the digitized signals with a given threshold level (444, 464), and for, in response to the digitized signals exceeding the threshold, generating the inhibit signals (456), whereby the radiation sources (16', 18', 20') are shut down when the sensed electromagnetic power exceeds the threshold.

In a particular embodiment of the invention, the control arrangement (310, 312, 332, 400), further activates an alarm signal (482) concurrently with the generation of the inhibit signals (480). The alarm signal may ultimately result in sounding of an aural or visual alarm.

In a particularly advantageous embodiment of the monitoring system (300), the control arrangement (310, 312, 332, 400) further compares (446) the digitized signals with a second threshold level. The second threshold level represents less sensed power than that represented by the given threshold level, and generates a warning signal when the second threshold level is crossed.

What is claimed is:

1. An integrated electromagnetic radiation monitoring system, comprising:
a set of controllable radiation sources for radiating electromagnetic energy having wavelengths greater than that of infrared, said radiation sources being capable of being shut down by radiation inhibit signals;
a plurality of sensors spaced about said set of radiation sources, which set of radiation sources may include a single radiation source, for sensing at least one of peak and average electromagnetic power within said wavelengths, for producing digitized signals representing said at least one of peak and average power; and
control means coupled to said set of radiation sources and to said plurality of sensors, for comparing said digitized signals with a given threshold level, and for, in response to said digitized signals exceeding said threshold, generating said inhibit signals.

2. A system according to claim 1, wherein said control means further activates an alarm signal concurrently with said generation of said inhibit signals.

3. A system according to claim 1, wherein said control means further compares said digitized signals with a second threshold level, said second threshold level representing less power than said given threshold level, and generates a warning signal when said second threshold level is crossed.

* * * * *